US012626762B2

(12) United States Patent
Chen et al.

(10) Patent No.: US 12,626,762 B2
(45) Date of Patent: May 12, 2026

(54) MEMORY DEVICE STRUCTURE AND FABRICATION METHOD

(71) Applicant: Yangtze Memory Technologies Co., Ltd., Wuhan (CN)

(72) Inventors: Liang Chen, Wuhan (CN); Wei Liu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 536 days.

(21) Appl. No.: 18/089,955

(22) Filed: Dec. 28, 2022

(65) Prior Publication Data

US 2024/0194260 A1 Jun. 13, 2024

(51) Int. Cl.
| | |
|---|---|
| *G11C 16/04* | (2006.01) |
| *H01L 23/528* | (2006.01) |
| *H10B 41/20* | (2023.01) |
| *H10B 41/35* | (2023.01) |
| *H10B 41/40* | (2023.01) |
| *H10B 43/20* | (2023.01) |
| *H10B 43/35* | (2023.01) |
| *H10B 43/40* | (2023.01) |
| *H10W 20/41* | (2026.01) |
| *H10W 20/42* | (2026.01) |
| *H01L 23/522* | (2006.01) |

(52) U.S. Cl.
CPC ......... *G11C 16/0483* (2013.01); *H10B 41/20* (2023.02); *H10B 41/35* (2023.02); *H10B 41/40* (2023.02); *H10B 43/20* (2023.02); *H10B 43/35* (2023.02); *H10B 43/40* (2023.02); *H10W 20/42* (2026.01); *H10W 20/435* (2026.01)

(58) Field of Classification Search
CPC ............. G11C 16/0483; H01L 23/526; H01L 23/5283; H10B 41/20; H10B 41/35; H10B 41/40; H10B 43/20; H10B 43/35; H10B 43/40; H10B 43/27
See application file for complete search history.

(56) References Cited

U.S. PATENT DOCUMENTS

| | | | | |
|---|---|---|---|---|
| 2020/0328176 A1* | 10/2020 | Liu | .......................... | H10B 12/50 |
| 2020/0328180 A1* | 10/2020 | Cheng | ...................... | H01L 25/18 |
| 2020/0328186 A1* | 10/2020 | Liu | .......................... | H01L 25/18 |
| 2021/0210460 A1* | 7/2021 | He | .......................... | H01L 24/94 |
| 2021/0249430 A1* | 8/2021 | Fulford | ................... | H10B 41/27 |
| 2022/0122932 A1* | 4/2022 | Oh | .......................... | H01L 24/08 |
| 2022/0351790 A1* | 11/2022 | Hsu | ..................... | G11C 16/3459 |
| 2022/0367503 A1* | 11/2022 | Sun | ......................... | H10B 43/40 |

* cited by examiner

*Primary Examiner* — Galina G Yushina
(74) *Attorney, Agent, or Firm* — Anova Law Group, PLLC

(57) ABSTRACT

A three-dimensional (3D) memory device includes an array wafer having a memory array layer and a complementary metal-oxide-semiconductor (CMOS) layer stacked together, the CMOS layer having high-voltage (HV) circuitry of a plurality of peripheral devices, and the memory array layer having a plurality of memory cells and a stair structure. The memory array layer includes at least one cell region for forming the memory cells and at least one stair structure region for forming the stair structure, and the CMOS layer includes at least one driver region. The 3D memory device further includes CMOS wafer having low-voltage (LV) circuitry and low-low-voltage (LLV) circuitry of the plurality of peripheral devices. The CMOS wafer includes at least one page buffer region. The array wafer and the CMOS wafer are bonded at a bonding interface.

16 Claims, 11 Drawing Sheets

100

100

600

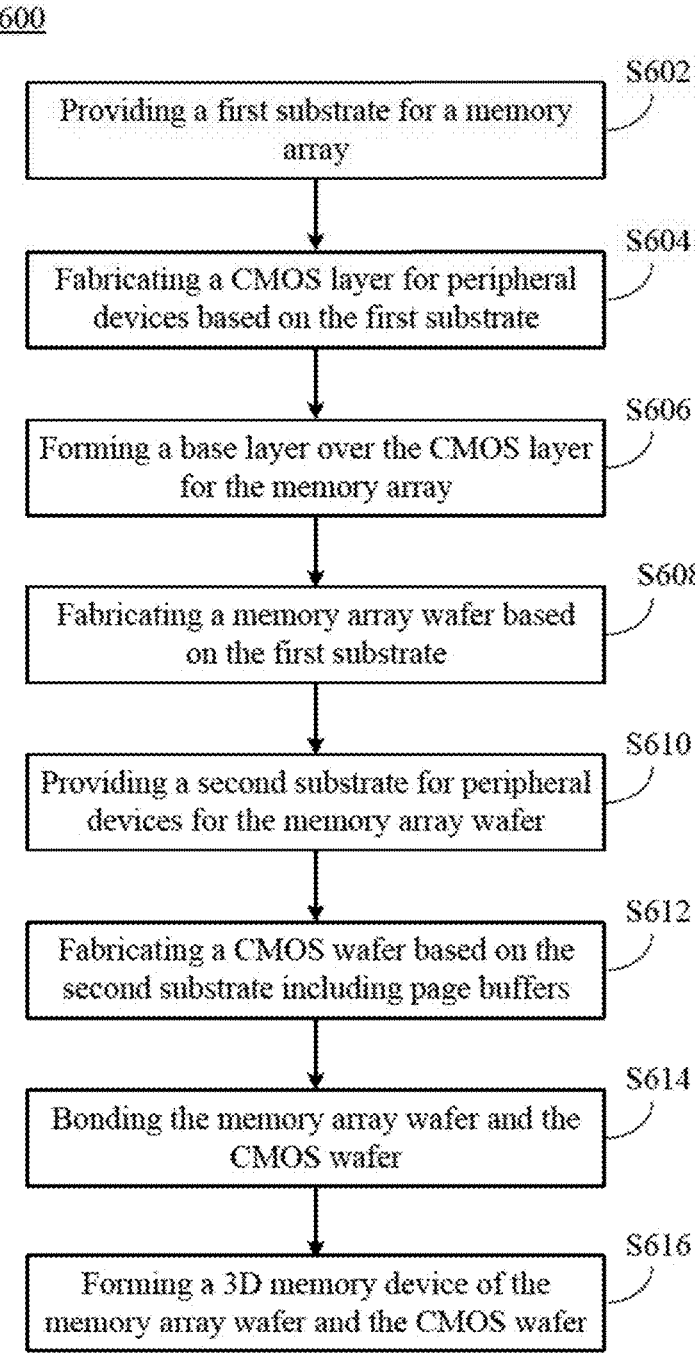

S602

Providing a first substrate for a memory array

S604

Fabricating a CMOS layer for peripheral devices based on the first substrate

S606

Forming a base layer over the CMOS layer for the memory array

S608

Fabricating a memory array wafer based on the first substrate

S610

Providing a second substrate for peripheral devices for the memory array wafer

S612

Fabricating a CMOS wafer based on the second substrate including page buffers

S614

Bonding the memory array wafer and the CMOS wafer

S616

Forming a 3D memory device of the memory array wafer and the CMOS wafer

MEMORY DEVICE STRUCTURE AND FABRICATION METHOD

CROSS-REFERENCE TO RELATED APPLICATION

This application claims the priority to Chinese Patent Application No. 202211585233.3, filed on Dec. 9, 2022, the content of which is incorporated herein by reference in its entirety.

FIELD OF THE DISCLOSURE

The present disclosure generally relates to the field of memory device and, more particularly, relates to a memory device structure and fabrication method thereof.

BACKGROUND

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit. 3D memory architecture can address the density limitation in planar memory cells. 3D memory architecture includes a memory array and peripheral devices for controlling signals to and from the memory array.

For 3D NAND memory devices, the peripheral devices are often located in a complementary metal-oxide-semiconductor (CMOS) area. As the number of 3D NAND layers continues to increase, the memory array size under the same capacity continues to decrease, which also requires the CMOS area to continue to shrink. Often more than one CMOS areas are used. Such requirement is often challenging when designing and fabricating the 3D NAND memory devices. The disclosed devices and fabrication methods are directed to solve one or more problems set forth above and other problems in the art.

BRIEF SUMMARY OF THE DISCLOSURE

One aspect of the present disclosure provides a method for forming a 3D memory device. The method includes forming an array wafer having a memory array layer and a CMOS layer stacked together, including: forming the CMOS layer having HV circuitry of a plurality of peripheral devices, and forming a plurality of memory cells and a stair structure in the memory array layer. The memory array layer includes at least one cell region for forming the memory cells and at least one stair structure region for forming the stair structure, and the CMOS layer includes at least one string driver region. The method also includes forming a CMOS wafer having LV circuitry and LLV circuitry of the plurality of peripheral devices, wherein the CMOS wafer includes at least one page buffer region; bonding the array wafer and the CMOS wafer at a bonding interface; and forming the 3D memory device based on the bonded array wafer and CMOS wafer.

Another aspect of the present disclosure provides a 3D memory device. The 3D memory device includes an array wafer having a memory array layer and a CMOS layer stacked together. The CMOS layer has HV circuitry of a plurality of peripheral devices, and the memory array layer has a plurality of memory cells and a stair structure. The memory array layer includes at least one cell region for forming the memory cells and at least one stair structure region for forming the stair structure, and the CMOS layer includes at least one string driver region. The 3D memory device also includes a CMOS wafer having LV circuitry and LLV circuitry of the plurality of peripheral devices. The CMOS wafer includes at least one page buffer region, and the array wafer and the CMOS wafer are bonded at a bonding interface.

Another aspect of the present disclosure provides a memory system. The memory system includes a 3D memory device, a memory controller coupled to the 3D memory device for controlling the 3D memory device; and an external interface for communicating with a host for storing information in the 3D memory device. The 3D memory device includes an array wafer having a memory array layer and a CMOS layer stacked together. The CMOS layer has HV circuitry of a plurality of peripheral devices, and the memory array layer has a plurality of memory cells and a stair structure. The memory array layer includes at least one cell region for forming the memory cells and at least one stair structure region for forming the stair structure, and the CMOS layer includes at least one string driver region. The 3D memory device also includes a CMOS wafer having LV circuitry and LLV circuitry of the plurality of peripheral devices. The CMOS wafer includes at least one page buffer region, and the array wafer and the CMOS wafer are bonded at a bonding interface.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

FIG. 6 illustrates an exemplary fabrication process of a 3D memory device consistent with various disclosed embodiments in the present disclosure;

DETAILED DESCRIPTION

Figure 1A:
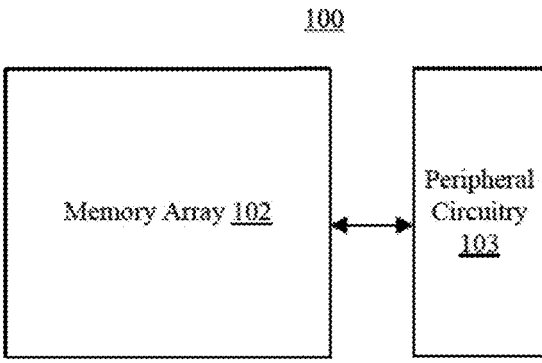
FIG. 1A illustrates a block diagram of a 3D memory device consistent with various disclosed embodiments in the present disclosure.

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It is noted that references in the specification to "one embodiment," "an embodiment," "an exemplary embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment.

Further, when a particular feature, structure or characteristic is described in contact with an embodiment, it would be within the knowledge of a person skilled in the pertinent art to affect such feature, structure or characteristic in contact with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. The term "vertical" refers to the direction perpendicular to the surface of a semiconductor substrate, and the term "horizontal" refers to any direction that is parallel to the surface of that semiconductor substrate.

As used herein, the term "3D memory device" refers to a semiconductor device with vertically oriented strings of memory cell transistors (referred to herein as "memory strings", such as NAND strings) on a laterally-oriented substrate so that the memory strings extend in the vertical direction with respect to the substrate.

FIG. 1A illustrates a block diagram of a 3D memory device 100 consistent with the disclosed embodiments of the present disclosure. In certain embodiments, the 3D memory device 100 be a 3D NAND memory device. 3D NAND is a flash memory technology which stacks memory cells vertically to increase capacity for higher storage density and lower cost per gigabyte.

Figure 1B:
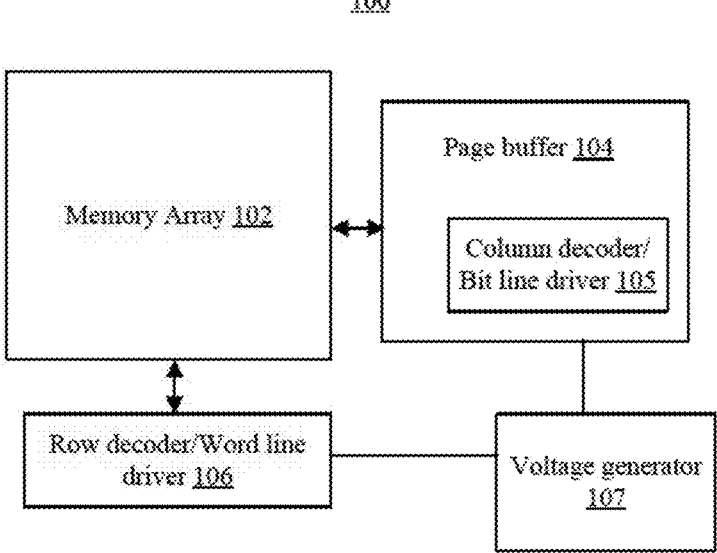
FIG. 1B illustrates certain devices included in the peripheral circuitry of a 3D memory device consistent with various disclosed embodiments in the present disclosure.

As shown in FIG. 1A, the 3D memory device (i.e., a 3D NAND memory device) 100 may include a memory cell array 102 (or simply memory array 102) and peripheral circuitry 103 coupled to the memory cell array 102. The memory cell array 102 may be a NAND flash memory cell array, in which memory cells are provided in the form of an array of NAND memory strings, each of which extends vertically above a substrate (not shown). In some implementations, each NAND memory string includes multiple memory cells coupled in series and stacked vertically. Each memory cell may hold a continuous analog value, such as a voltage or charge, depending on the number of electrons trapped within the area of the memory cells. The peripheral circuitry 103 may include supporting circuits for the memory array 102 to form the 3D memory 100. FIG. 1B illustrates certain devices included in the peripheral circuitry 103 consistent with the disclosed embodiments.

As shown in FIG. 1B, for example, the peripheral circuitry 103 may include a page buffer 104, which may include a column decoder/bit line driver 105, coupled to the memory cells, and a column decoder/word line driver 106 coupled to the string structure of the memory array for memory operations. The peripheral circuitry 103 may also include a voltage generator 107 for providing varies voltages for the peripheral circuitry 103, including the page buffer 104, column decoder/bit line driver 105, and column decoder/word line driver 106. Other devices are also be included in the peripheral circuitry 103.

The devices in the peripheral circuitry 103 may needed to be operated at different voltage levels. The voltages provided by voltage generator 107 to, for example, row decoder/word line drivers 308, column decoder/bit line drivers 306, and page buffer 304 may need to be above certain levels sufficient to perform a memory operation. For example, the voltage provided to the buffer circuitry in the page buffer 104 and/or the other logic circuitry may be between 2V and 3.3V, such as 3.3V, and the voltage provided to the drive circuitry in the row decoder/word line drivers 106 and/or the column decoder/bit line drivers 105 may be between 5V and 30V.

Figure 2:
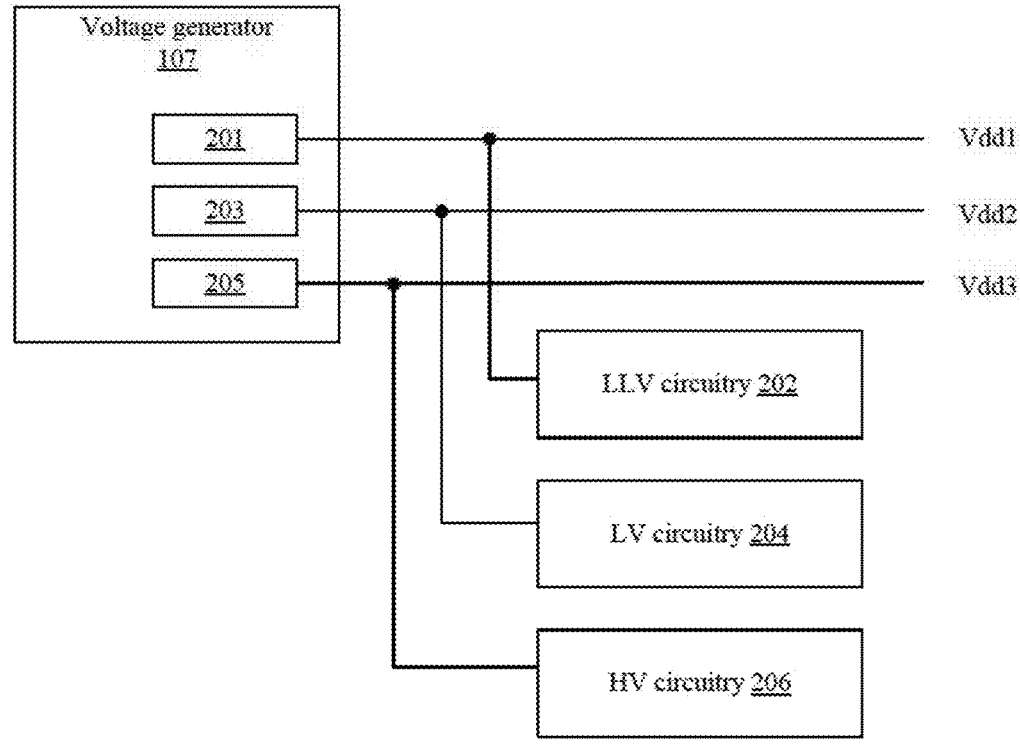
FIG. 2 illustrates an exemplary arrangement of multiple voltages and circuitry consistent with various disclosed embodiments in the present disclosure.

That is, the 3D memory device (e.g., 3D NAND flash memory device) may require a wide range of voltages to be supplied by the voltage generator and provided to different memory peripheral circuits. FIG. 2 illustrates an exemplary arrangement of multiple voltages and circuitry consistent with the disclosed embodiments. As shown in FIG. 2, the voltage generator 107 may include a low-low voltage (LLV) source 201, a low-voltage (LV) source 203, and a high-voltage (HV) source 205, each configured to provide a voltage at a respective level (Vdd1, Vdd2, or Vdd3). For example, Vdd3>Vdd2>Vdd 1. The LLV source 201 may be configured to provide a voltage below 2V, such as between 0.9V and 2V (e.g., 0.9V, 0.95V, 1V, 1.05V, 1.1V, 1.15V, 1.2V, 1.25V, 1.3V, 1.35V, 1.4V, 1.45V, 1.5V, 1.55V, 1.6V, 1.65V, 1.7V, 1.75V, 1.8V, 1.85V, 1.9V, 1.95V, any range bounded by any one of these values being the lower limit, or any range bounded by any two of these values). In one embodiment, the voltage is 1.2V.

Further, the LV source 203 may be configured to provide a voltage between 2V and 3.3V (e.g., 2V, 2.1V, 2.2V, 2.3V, 2.4V, 2.5V, 2.6V, 2.7V, 2.8V, 2.9V, 3V, 3.1V, 3.2V, 3.3V, any range bounded by any one of these values being the lower limit, or in any range bounded by any two of these values). In one embodiment, the voltage is 3.3V. The HV source 205 may be configured to provide a voltage greater than 3.3V, such as between 5V and 30V (e.g., 5V, 6V, 7V, 8V, 9V, 10V, 11V, 12V, 13V, 14V, 15V, 16V, 17V, 18V, 19V, 20V, 21V, 22V, 23V, 24V, 25V, 26V, 27V, 28V, 29V, 30V, any range bounded by any one of these values being the lower limit, or in any range bounded by any two of these values). It should be understood that the voltage ranges described above with respect to HV source 205, LV source 203, and LLV source 201 are for illustrative purposes and are not limiting, and that HV source 205, LV source 203, and LLV source 201 may provide any other suitable voltage ranges.

Further, based on the appropriate voltage levels (Vdd1, Vdd2, or Vdd3) of the memory peripheral circuitry (e.g., peripheral circuitry 103), the devices of the peripheral circuitry 103 may include LLV circuitry 202, LV circuitry 204, and HV circuitry 206, which may be coupled to the LLV source 201, LV source 203, and HV source 205, respectively. The LLV circuitry 202 and LV circuitry 204 may be referred as low voltage circuitry or lower voltage circuitry, and HV circuitry 206 may be referred as high voltage circuitry or higher voltage circuitry, which are operating at the LLV Vdd1, LV Vdd2, and HV Vdd3, respectively.

In some embodiments, the HV circuitry 206 includes one or more drive circuits coupled to the memory cell array by word lines, bit lines, and various gate lines, etc., and configured to drive the memory cell array by applying voltages at appropriate levels to the word lines, bit lines, and various gate lines, etc., when performing a memory operation (e.g., read, program, or erase). In one example, the HV circuitry 206 may include word line driver circuitry (e.g., in row decoder/word line driver 106) coupled to the word lines and applying a programming voltage (Vprog) or pass voltage (Vpass) in a range of, for example, 5V and 30V to the word lines during a programming operation. In another example, the HV circuitry 206 may include a bit line driver circuit (e.g., in the column decoder/bit line driver 105) coupled to the bit lines and applying an erase voltage (Veras) in a range of, for example, 5V and 30V to the bit lines during an erase operation.

The LV circuitry 204 may include the buffer circuitry of the page buffer 104 (e.g., in latches of page buffer 104) and may be configured to buffer data read from or programmed to the memory cell array in some implementations. For example, a voltage of, for example, 3.3V may be provided to the buffer of the page buffer 104 by the LV source 203. LV circuitry 204 may also include certain control logic circuitry (e.g., control logic). Further, the LLV circuitry 202 may include I/O circuitry configured to interface the memory cell array with a memory controller (not shown). For example, a voltage of, for example, 1.2V may be provided to the I/O circuit by LLV source 201.

Figure 3A:
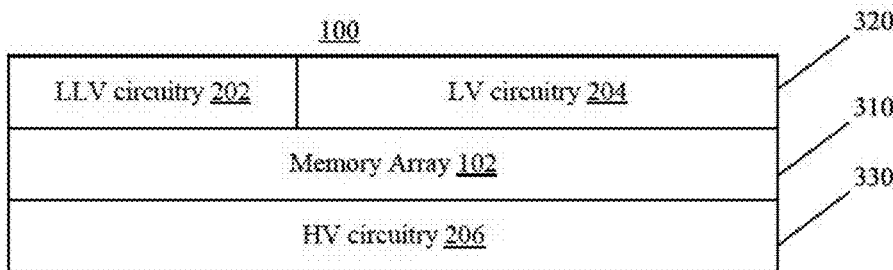
FIG. 3A illustrates a schematic diagram of peripheral circuits provided with various voltages arranged in separate semiconductor structures consistent with various disclosed embodiments in the present disclosure.

In certain embodiments, to reduce the total area occupied by memory peripheral circuitry, peripheral circuitry 103 may be formed separately in different planes based on different performance requirements (e.g., applied voltages). For example, FIG. 3A illustrates a schematic diagram of peripheral circuits provided with various voltages arranged in separate semiconductor structures, consistent with disclosed embodiments. As shown in FIG. 3A, the 3D memory device 100 may include three semiconductor structure planes or layers, a memory array semiconductor layer 310, a first CMOS semiconductor layer 320, and a second CMOS semiconductor layer 330. Other layers/planes may also be included. The semiconductor layer 310 may include the memory array 102. The semiconductor layer 320 may include the LLV circuitry 202 and the LV circuitry 204 of the peripheral circuitry. The semiconductor layer 330 may include the HV circuitry 206 of the peripheral circuitry.

That is, the lower voltage circuits (the LLV circuitry 202 and the LV circuitry 204) and the HV circuit 206 are separated, for example, in semiconductor structures 320 and 330, respectively, due to their significantly different voltages and the resulting different device dimensions, such as different substrate thicknesses and different gate dielectric thicknesses. In one example, the thickness of the semiconductor layer (e.g., substrate or thinned substrate) in which HV circuitry 206 is formed in semiconductor structure 330 may be greater than the thickness of the semiconductor layer (e.g., substrate or thinned substrate) in which LLV circuitry 202/LV circuitry 204 is formed in semiconductor structure 320. In another example, the thickness of the gate dielectric forming the transistors of HV circuitry 206 may be greater than the thickness of the gate dielectric forming the transistors of LLV circuitry 202/LV circuitry 204. For example, the difference in thickness may be at least 5 times. Although the semiconductor layers 320 and 330 are separated by semiconductor layer 310 as shown, the semiconductor layers 320 and 330 may also be stacked together.

Figure 3B:
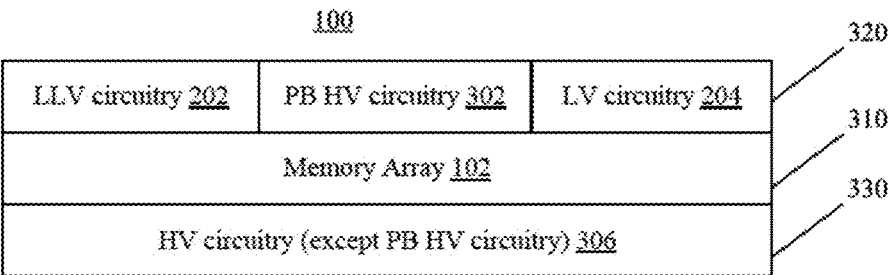
FIG. 3B illustrates another schematic diagram of peripheral circuits provided with various voltages arranged in separate semiconductor structures consistent with various disclosed embodiments in the present disclosure.

FIG. 3B illustrates another schematic diagram of peripheral circuits provided with various voltages arranged in separate semiconductor structures, consistent with disclosed embodiments. As shown in FIG. 3B, the 3D memory device 100 may also include three semiconductor structure planes or layers, a memory array semiconductor layer 310, a first CMOS semiconductor layer 320, and a second CMOS semiconductor layer 330. The semiconductor layer 310 may include the memory array 102. The semiconductor layer 320 may include the LLV circuitry 202 and the LV circuitry 204, as well as HV circuitry 302 of the page buffer 104. The semiconductor layer 330 may include the HV circuitry 306, which is the HV circuitry 206 minus the HV circuitry of the page buffer 104 (e.g., circuits of the bit line driver 105).

That is, in addition to separating the lower voltage circuits (the LLV circuitry 202 and the LV circuitry 204) and the HV circuitry 306 in the semiconductor layer 320 and the semiconductor layer 330, respectively, the HV circuitry of the page buffer 104 (i.e., PB HV circuitry 302) and the HV circuitry 306 are also separated in the semiconductor layer 320 and the semiconductor layer 330, respectively. In some embodiments, although the semiconductor layers 320 and 330 are separated by semiconductor layer 310 as shown, the semiconductor layers 320 and 330 may also be stacked together. For a more specific example of the arrangement shown in FIG. 3B, FIG. 4 illustrates an exemplary 3D memory device consistent with the disclosed embodiments of the present disclosure.

Figure 4:
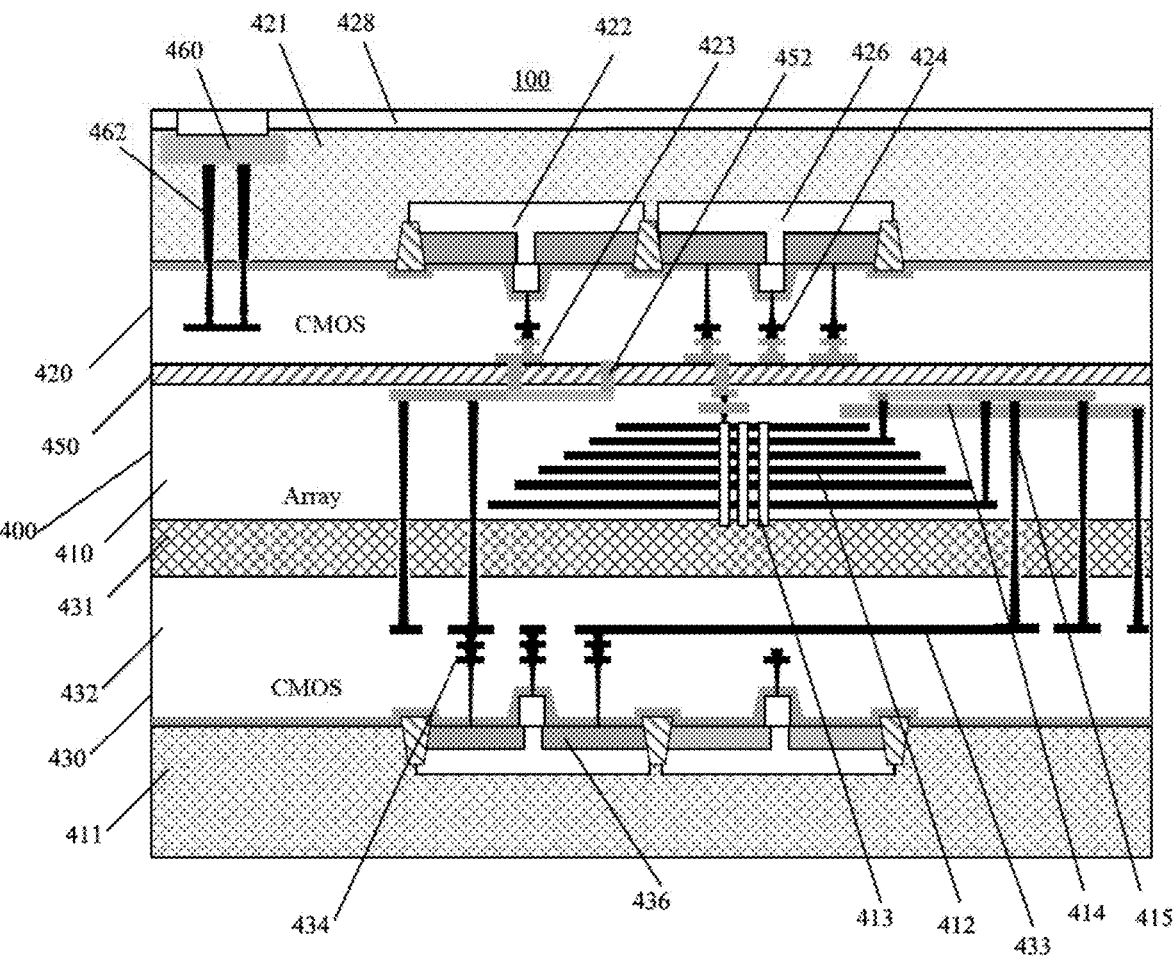
FIG. 4 illustrates an exemplary 3D memory device consistent with various disclosed embodiments in the present disclosure.

As shown in FIG. 4, the 3D memory device (i.e., 3D NAND memory device) 100 may include a memory cell array wafer ("array wafer") 400, and a complementary metal-oxide-semiconductor wafer ("CMOS wafer") 420. Further, the array wafer 400 may include a memory array layer 410 and a CMOS layer 430. Other components may also be included. The memory array layer 410 corresponds to the memory array semiconductor layer 310, the CMOS wafer 420 corresponds to the first CMOS semiconductor layer 320, and the CMOS layer 430 corresponds to the second CMOS semiconductor layer 330.

The array wafer 400 or the memory array layer 410 may include the memory structures for the 3D memory device 100, and the CMOS wafer 420 and the CMOS layer 430 may include peripheral devices for the memory structures of the array wafer 400. The memory array layer 410, the CMOS wafer 420, and the CMOS layer 430 may be stacked together to form the framework of the 3D memory device 100. In certain embodiments, the CMOS layer 430 may be formed using a peripheral under chip (PUC) mechanism, or a CMOS under array (CUA), to have the CMOS peripheral devices under the memory structures of the array wafer 400 or the memory array layer 410. More specifically, the CMOS layer 430 may include high voltage circuits for the array wafer 400, while the CMOS wafer 420 may include lower voltage circuits as well as certain specific high voltage circuits, such as HV circuitry of the page buffers for the memory structures of the array wafer 400.

The array wafer 400 may include a base layer 431, a plurality of memory cells 412 and a stair structure (SS) 413 formed on the base layer 431, and the CMOS layer 430. The CMOS layer 430 may include a substrate 411 and a device layer 432. Other components may also be included.

In certain embodiments, the base layer 431 may include a polysilicon layer on which the memory cells 412 and stair structure 413 are formed. In a 3D NAND memory device, the memory cells 412 may be formed as strings of memory cells, and the strings of memory cells 412 may form a plurality of memory blocks of the 3D NAND memory device. The plurality of memory blocks may be grouped into pages to form a 3D memory structure. For example, semiconductor pillars may be formed in the channel holes (CH) that vertically penetrate through a conductor-dielectric pair stack. The stair structure SS may be provided at the two opposite ends of each memory block for the formation of contacts such as through array contacts (TACs). That is, in the 3D memory device 100, memory cells 412 for storing data are stacked vertically to form a stacked memory structure. The stair structure 413 may be formed at one or more sides of the stacked memory structure for certain purposes, such as word line fan-out. The stacked memory structure may include a plurality of semiconductor channels, and the semiconductor channel can be vertical to the major surface of the base layer 431.

The base layer (e.g., the polysilicon layer) 411 may be in contact with the sources of the NAND memory strings. That is, the polysilicon layer 431 may serve as a common source plate for multiple NAND memory strings. The polysilicon layer 431 may be formed in the array wafer 400 using one or more thin film deposition processes, including but not limited to Chemical Vapor Deposition (CVD), Physical Vapor Deposition (PVD), Atomic Layer Deposition (ALD), or any combination thereof, compatible with a PUC/CUA process. Other materials may also be used to form the base layer 431.

Further, in the CMOS layer 430, the substrate 411 and the device layer 432 may include some of the peripheral circuits of the memory cell array, and the memory cell array and the peripheral circuits in the CMOS layer 430 may be separated in the vertical direction by the polysilicon layer 431. That is, the polysilicon layer 431 may be vertically disposed between the memory cell array and the peripheral circuits in the CMOS layer 430. For example, devices 436 of certain HV circuitry for the memory cell array may be formed in the device layer 432, under the polysilicon layer 431 and on the substrate 411. The substrate 411 may be made of a material including silicon, germanium, SiGe, SiC, silicon on insulator (SOI), germanium on insulator (GOI), glass, III-V group compound (e.g., GaN, GaAs, InAs, etc.), or any other appropriate semiconductor material. In one embodiment, the substrate 411 is a silicon substrate.

Further, the array wafer 400 may also include various interconnects (e.g., sub-micron interlayer vias (ILVs) or micron-scale or tens of micron-scale through-substrate vias (TSVs)) to form direct short-range (e.g., sub-micron to tens of micron-scale) electrical connections among devices within the memory cell array and devices within the device layer 432, and/or between the memory cell array and peripheral circuitry in the device layer 432. For example, the device layer 432 also include horizontal interconnects 433 and vertical interconnects 434. The memory cell array may also include horizontal interconnects 414 and vertical interconnects 415. Other interconnects may also be included.

Further, the CMOS wafer 420 may include a substrate 421, a plurality of CMOS devices 422, various interconnect structures 423, and a variety of through silicon via (TSV) 424. Other structures and devices may also be included. The substrate 421 may be made of a material including silicon, germanium, SiGe, SiC, silicon on insulator (SOI), germanium on insulator (GOI), glass, III-V group compound (e.g., GaN, GaAs, InAs, etc.), or any other appropriate semiconductor material. In one embodiment, the substrate 421 is a silicon substrate.

The CMOS devices 422 may refer generally to certain peripheral devices for the array wafer 400 to support the memory arrays/cells and/or for the CMOS wafer 420. For example, the peripheral devices 422 may include digital signal circuits, analog signal circuits, and/or mixed signal circuits, such as row decoders and column decoders, page buffers, sense amplifiers, timing and control, or the like. In certain embodiments, the CMOS devices 422 may include the LLV circuitry 202 and LV circuitry 204 for the 3D memory device 100, and the CMOS devices 426 may include the PB HV circuits 206 of the page buffer. That is, for the page buffer, all of the LLC circuits (if any), LV circuits, and HV circuits of the page buffer may be included in the CMOS wafer 420. In other words, the page buffer of the 3D memory device 100 may be entirely formed in the CMOS wafer 420.

Further, for the CMOS wafer 420, the interconnect structures 423 may be formed for providing vertical electrically interconnects between the array wafer 400 and the CMOS wafer 420, i.e., between memory structures of array wafer 400 and devices of the CMOS wafer 420, and/or among devices of the CMOS wafer 420. The through silicon via (TSV) 424 may be formed together with certain interconnect structures 423 to provide vertical connections.

The array wafer 400 and the CMOS wafer 420 may be bonded through the bonding interface 450. The bonding interface 450 may be a separate layer for bonding the array wafer 400 and the CMOS wafer 420, or may be a joint surface between the bonded array wafer 400 and CMOS wafer 420. For example, the bonding interface may include the interface between two dielectric layers (e.g., between a silicon nitride layer and a silicon oxide layer) and/or the interface between two conductive layers (e.g., between two metal layers). Further, one or more joint structures 452 may be formed at the bonding interface 450 to form electrical connections. For example, the joint structures 452 may be formed by corresponding one or more joint structures in the array wafer 400 and one or more joint structures in the CMOS wafer 420 being made contacted with each other at the bonding interface 450 for electrical connections.

The bonding interface 450 may be formed in any appropriate process. For example, the bonding interface 450 may be formed by chemical bonds between the dielectric layers and/or the conductive layers on both sides of the bonding interface. For another example, the bonding interface 450 can be formed by physical interaction (e.g., inter-diffusion) between the dielectric layers and/or the conductive layers on both sides of the bonding interface. In some embodiments, the bonding interface can be formed after a plasma treatment or a thermal treatment of the surfaces from both sides of the bonding interface prior to the bonding process.

Because the array wafer 400 and the CMOS wafer 420 are formed separately and then bonded together, damages from the various processes to form various layers and through silicon contacts (TSCs) may be performed on separate wafers without damaging each other's existing structures.

Further, the CMOS wafer 420 may include an insulating layer 428 formed on the back side of the substrate 421. The insulating layer 428 may have one or more openings for encapsulating and forming at least one array pad 460. The at least one array pad 460 is in in contact with the least one through substrate contact (TSC) 462. The TSC 462 may be formed by conductor materials, such as W, Co, Cu, Al, polysilicon, silicides, or any combination thereof. In some embodiments, other conductor materials may be also used.

By using the at least one array pad 460 on the back side of the substrate 421, rather than the surrounding regions of the array substrate, other circuits including the periphery circuits of the 3D memory device 100 can be connected out through the surface side of the 3D memory device 100. Thus, the size of the 3D memory device 100 can be reduced and the integration degree of the 3D memory device can be increased. Further, the risk of plasma-induced damage (PID) to the CMOS devices can also be eliminated.

In certain embodiments, the memory cells 412 and the stair structure 413 may be formed at certain regions on the substrate 411/array wafer 400. For example, the substrate 411 may include one or more cell regions for forming the memory cells, and one or more stair structure regions for forming the stair structure. The one or more cell regions and the one or more stair structure regions may be arranged in a predetermined way to increase efficient and/or reliability of the fabrication process of the array wafer 400.

Figure 5A:
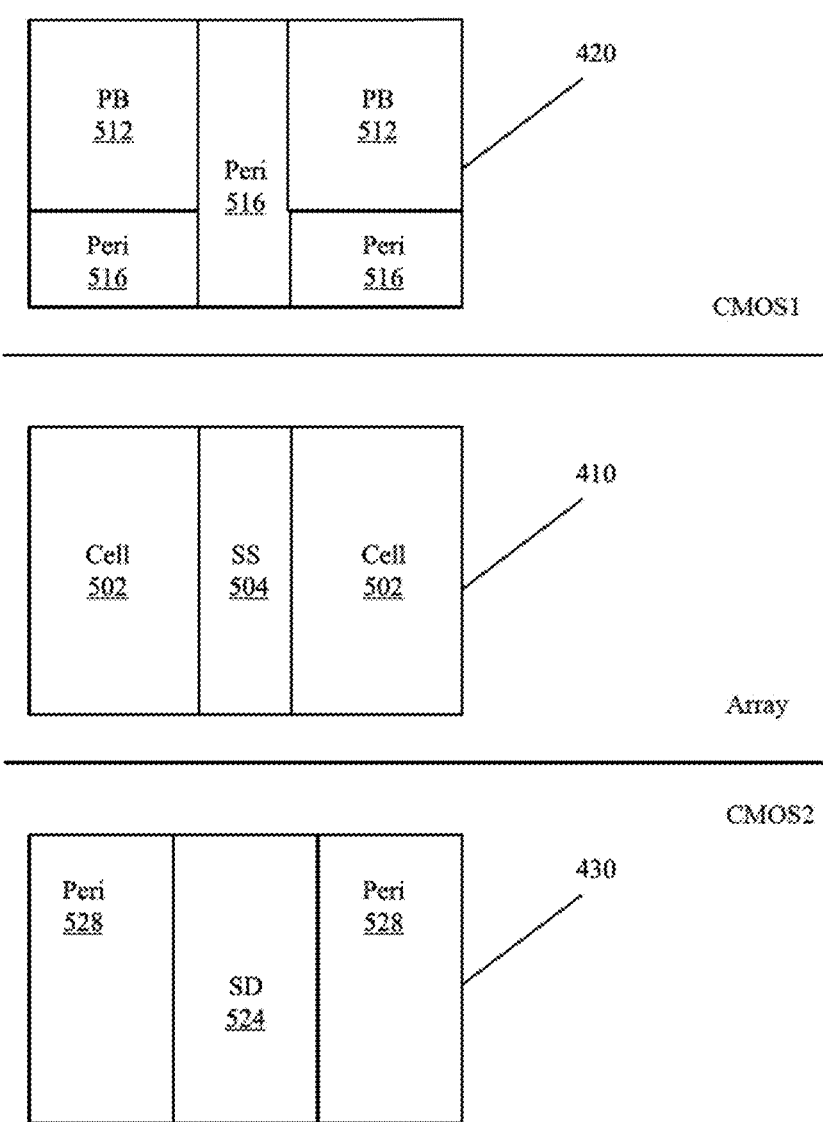
FIG. 5A illustrates an arrangement of one or more cell regions and one or more stair structure regions and corresponding CMOS regions consistent with various disclosed embodiments in the present disclosure.

FIG. 5A illustrates an arrangement of one or more cell regions and one or more stair structure regions and corresponding CMOS regions consistent with the disclosed embodiments. As shown in FIG. 5A, the array wafer 400 may include a stair structure region SS 504 at the center of the array wafer 400, and two cell regions Cell 502 at each side of the array wafer 400.

Figure 5B:
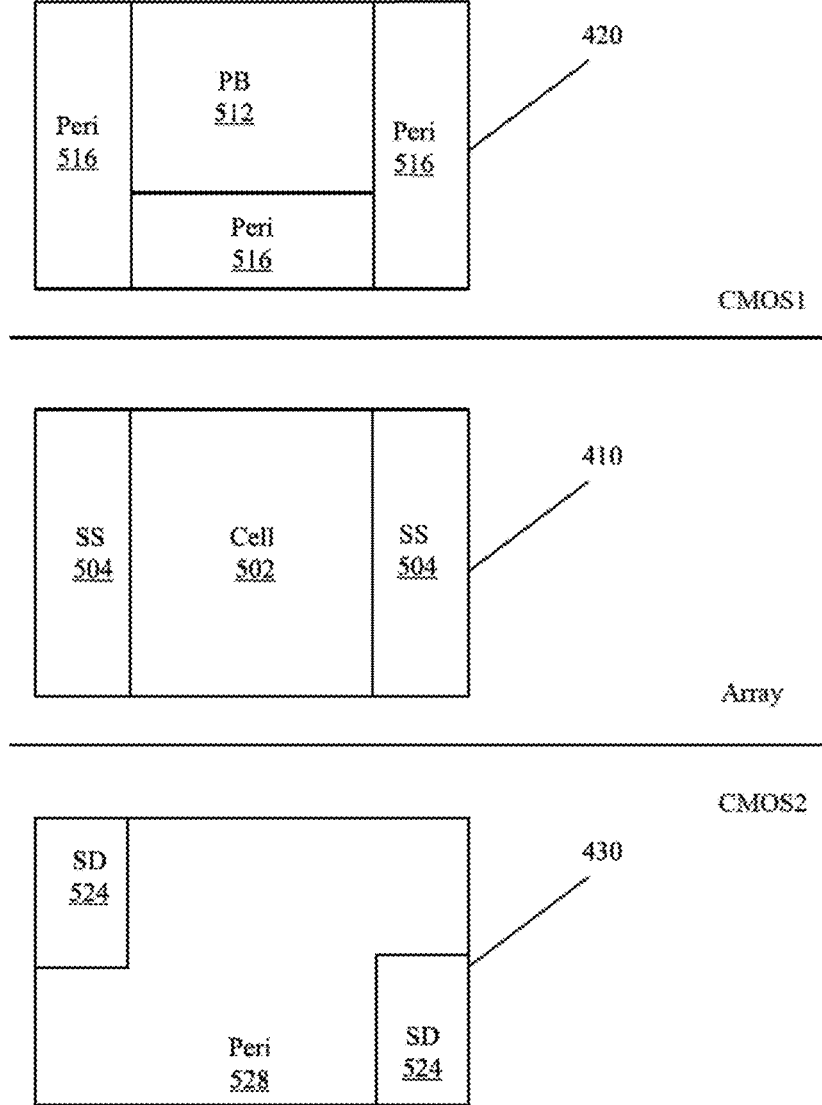
FIG. 5B illustrates another arrangement of one or more cell regions and one or more stair structure regions and corresponding CMOS regions consistent with various disclosed embodiments in the present disclosure.

FIG. 5B illustrates another arrangement of the one or more cell regions and the one or more stair structure regions and corresponding CMOS regions consistent with the disclosed embodiments. As shown in FIG. 5B, the array wafer 400 may include a cell region Cell 502 at the center of the array wafer 400, and two SS regions 504 at each side of the array wafer 400. Other layouts may also be used.

Further, the memory array layer 410 of the array wafer 400, the CMOS wafer 420, and the CMOS layer 430 are stacked together to form the framework of the 3D memory device 100. In certain embodiments, when forming the CMOS layer 430, under the memory cell structure of the array wafer 400, the peripheral devices in the CMOS layer 430 may be formed in certain regions based on the device arrangement of the memory structure of the array wafer 400. Similarly, corresponding devices in the array wafer 400 and the CMOS wafer 420 may need to be formed in certain regions and at precise locations, so as to be bonded together. That is, the memory structure regions shown in FIGS. 5A and 5B on the array wafer 400 and device regions of the CMOS wafer 420 and the CMOS layer 430 are corresponding to each other so that corresponding devices may be interconnected reliably.

For the 3D memory device 100, data is stored in the memory cells 412, which are formed in the cell region(s) Cell 202 of the array wafer 400. The memory cells 412 may formed as a plurality of memory blocks, and the plurality of memory blocks grouped into pages. Further, bit lines are also formed to connect the memory cells in the pages. The bit lines may also be formed in the cell region.

To support the memory cells, page buffers are included in the peripherical devices in the CMOS wafer 420. Each page buffer may include circuits for supporting operations of the pages of the plurality of memory blocks. The circuits in the page buffers may be connected to the bit lines to form electrical connections. That is, a page buffer may be coupled to a bit line to perform certain operation on the memory element on the bit line. For example, the page buffer may be coupled to the bit line and a terminal of the voltage bias transistor. The page buffer may charge the bit line to a predetermined voltage according to a bit line bias voltage during a pre-charge operation, and may form a sensing path from the bit line to a sensing amplifier during a sense operation. Thus, the page buffer may include a plurality of devices to facilitate these operations, such as transistors, capacitors, and/or resisters, and metal connections among these devices, etc. These devices of the page buffer may include HV circuits (e.g., driver circuits), LV circuits, and/or LLV circuits (if any), i.e., all page buffer circuits may be included in the CMOS wafer 420. That is, although the CMOS layer 430 may contain HV circuitry of the array wafer 400, the HV circuits of the page buffers may be included in the CMOS wafer 420, together with other LV circuitry and LLV circuitry of the 3D memory device 100.

On the other hand, for the 3D memory device 100, the stair structure is formed in the stair structure region(s) SS 504 of the array wafer 400. The CMOS layer 430 may include circuits for the stringer driver (e.g., word line driver), as part of the HV circuitry 306, to support the string structure of the memory array in the array wafer 400.

Correspondingly, the peripheral circuitry 103 may be formed in a number of regions on the substrate 421 and on the substrate 411, and the regions for the peripheral circuitry 103 for the CMOS wafer 420 and for the CMOS layer may be determined according to the layout of the memory structure of the array wafer 400. That is, the peripheral devices on the CMOS wafer 420 and the CMOS layer 430 are formed corresponding to the memory structure of the array wafer 400, such that the peripheral devices on the CMOS wafer 420 and the CMOS layer 430 can support the function of the memory structure on the array wafer 400 (e.g., for power bus and metal routing).

For example, as shown in FIG. 5A, horizontally or laterally, the CMOS layer 430 may include a string driver region SD 524 at the center of the CMOS layer 430, corresponding to the stair structure region SS 504 of the array wafer 400. The CMOS layer 430 may also include two peripheral device regions Peri 528 at each side of the CMOS layer 430 to form the other high voltage devices of the HV circuitry 306. Further, the CMOS wafer 420 may include two page buffer regions PB 512 at each side of the CMOS wafer 420, corresponding to the cell regions Cell 502 of the array wafer 400, to form circuits of the page buffers, including the HV circuits of the page buffers. The CMOS wafer 420 may also include two peripheral regions Peri 516 to form certain other peripheral devices on the CMOS wafer 420, including the LV circuitry 204 and the LLV circuitry 202. In one embodiment, the string driver region SD 524 is under the region SS 504, and the cell region Cell 502 may be under the page buffer region PB 512. Other regions may also be used.

For another example, as shown in FIG. 5B, horizontally or laterally, the CMOS layer 430 may include two string driver regions SD 524 at each side of the CMOS layer 430 (e.g., the upper left corner region and the lower right corner region), corresponding to the stair structure regions SS 504 of the array wafer 400. The CMOS layer 430 may also include a peripheral device region Peri 528 at the center region of the CMOS layer 430 to form the other high voltage devices of the HV circuitry 306. Further, the CMOS wafer 420 may include a page buffer region PB 512 at the center region of the CMOS wafer 420 (e.g., the upper and middle portions), corresponding to the cell region Cell 502 of the array wafer 400, to form circuits of the page buffers, including the HV circuits of the page buffers. The CMOS wafer 420 may also include two peripheral regions Peri 516 at each side of the CMOS wafer 420 and a peripheral region Peri 516 at the lower center portion of the CMOS wafer 420 to form certain other lower voltage peripheral devices on the CMOS wafer 420, including the LV circuitry 204 and the LLV circuitry 202. In one embodiment, the string driver regions SD 524 is under the regions SS 504, and the cell region Cell 502 may be under the page buffer region PB 512. Other regions may also be used.

Accordingly, by including the HV circuits of the page buffers in the CMOS wafer 420, instead of including the HV circuits of the page buffers in the CMOS layer 430, the interconnects between the HV circuits of the page buffers and other LV/LLV circuits of the page buffers can be formed within the CMOS wafer 420 without TACs. Further, because the region SD 524 and the region PB 512 are formed in different CMOS layers/planes, any conflict of layout of the region SD 524 and the region PB 512 can be avoided.

FIG. 6 shows a fabrication process 600 of the 3D memory device 100 consistent with the disclosed embodiments, and FIGS. 6A-6H show various fabrication stages of the fabrication process 600 consistent with the disclose embodiments. As shown in FIG. 6, at S602, also referring to FIG. 6A, a first substrate 411 is provided for fabricating a 3D memory array. The first substrate may be made of a material including silicon, germanium, SiGe, SiC, silicon on insulator (SOI), germanium on insulator (GOI), glass, III-V group compound (e.g., GaN, GaAs, InAs, etc.), or any other appropriate semiconductor material. For example, the first substrate includes a semiconductor substrate, such as a single crystalline silicon substrate. The first substrate 411 may also be a single layer substrate or a multi-layer substrate, for example, a monocrystalline single-layer substrate, a polycrystalline silicon (polysilicon) single-layer substrate, a polysilicon and metal multi-layer substrate, etc.

Figure 6A:
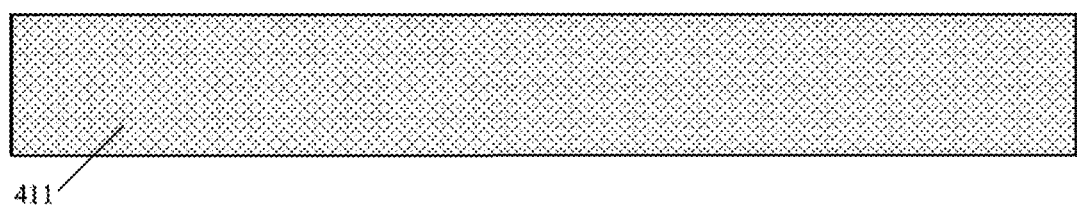
FIGS. 6A-6H illustrate various fabrication stages of a fabrication process consistent with various disclosed embodiments in the present disclosure.
Figure 6B:
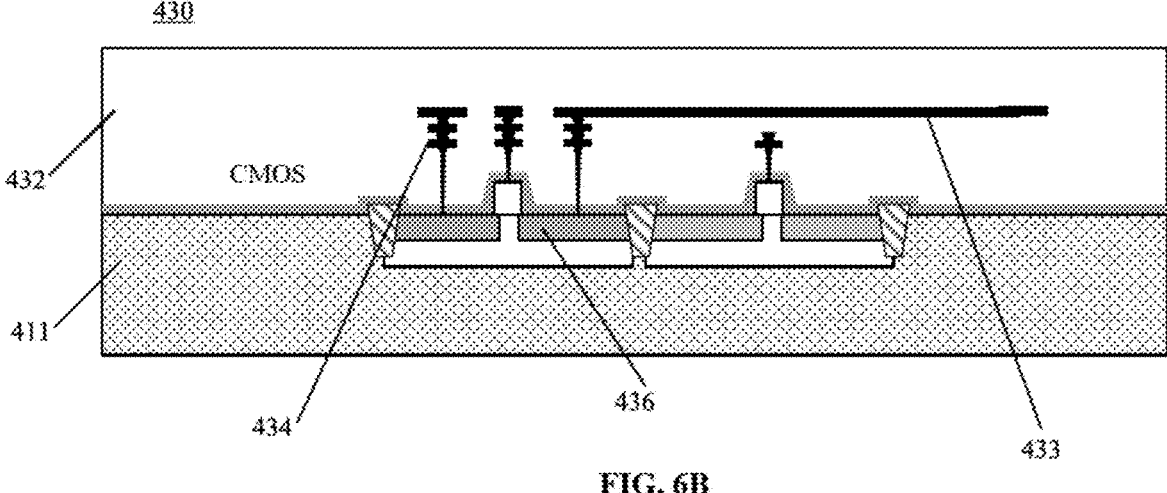

Further, at S604, also referring to FIG. 6B, a CMOS layer 430 (including device layer 432) is fabricated based on the first substrate 411 and certain peripheral devices 436 (e.g., HV circuitry 306) of the memory array are also formed on the first substrate. Various interconnects 433 and 434 for the peripheral devices may also be formed. For example, the string driver and other HV circuits may be formed, and string driver circuits may be formed in the string driver region(s) of the CMOS layer, which corresponds to the stair structure region of the first substrate 411.

Figure 6C:
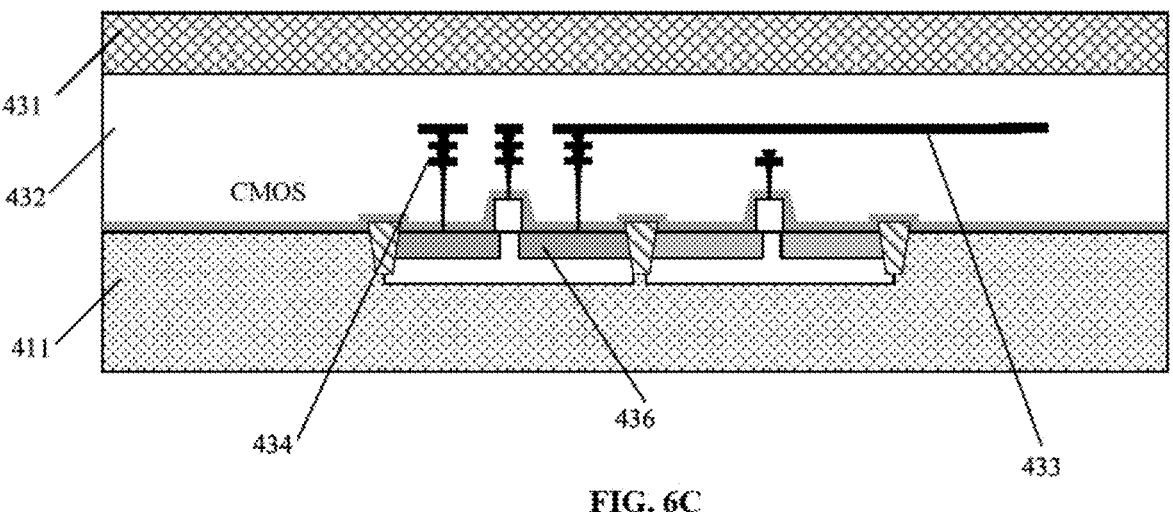

Further, at S606, also referring to FIG. 6C, a polysilicon layer 431 is formed on the CMOS layer 430, which serves as a base layer for forming the memory array. The polysilicon layer 431 may be formed using one or more thin film deposition processes, including but not limited to Chemical Vapor Deposition (CVD), Physical Vapor Deposition (PVD), Atomic Layer Deposition (ALD), or any combination thereof, compatible with a PUC/CUA process.

Figure 6D:
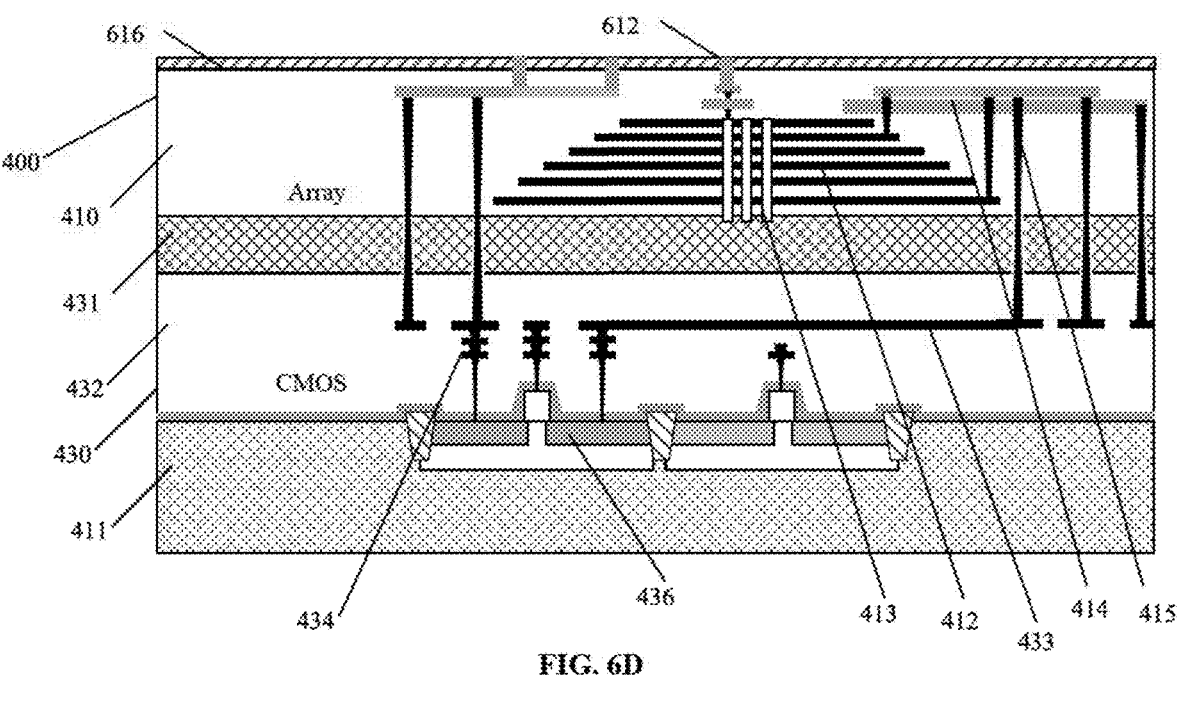

Further, at S608, also referring to FIG. 6D, a memory array is fabricated based on the polysilicon layer 431. For example, the polysilicon layer 431 may include a stair structure region and a cell region, and a stair structure 443 may be formed in the stair structure region and memory cells may be formed in the cell region in the form of an array of NAND strings extending vertically above the first substrate. Further, interconnects, such as interconnect contacts and vertical through contracts, may be formed for the vertical direction, and word lines and bit lines may also be formed to connect the stair structure and the memory cells. The bit lines may be formed in the cell region on the memory array wafer may be connected to the memory cells. Other devices may also be formed.

Accordingly, the array wafer 400 is now formed. In one embodiment, an array joint layer 616 may also be formed to include joint structures for later bonding with a CMOS wafer. The array joint layer 616 may be an interconnection layer including one or more joint structures 612 embedded in a dielectric layer. The joint structures 612 may include contacts, single-layer/multi-layer vias, conductive lines, plugs, pads, and/or any other suitable conductive structures that are made by conductive materials including W, Co, Cu, Al, doped silicon, silicides, or any combination thereof. The dielectric layer may include dielectric materials including silicon oxide, silicon nitride, silicon oxynitride, or any combination thereof. The joint structures 612 may be exposed on the top surface of the array joint layer on the array wafer. Other processes and devices may also be performed or formed.

Figure 6E:
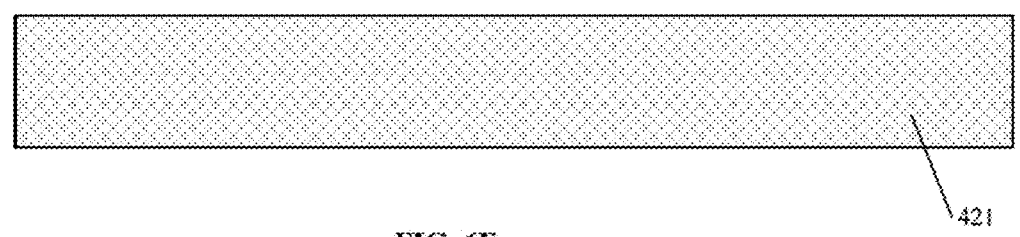

Further, at S610, also referring to FIG. 6E, a second substrate 421 is provided for forming certain peripheral devices for the memory array wafer (e.g., LLV circuitry 202, LV circuitry 204, and PB HV circuitry 302). The second substrate 421 may include any suitable semiconductor material that can include silicon (e.g., monocrystalline silicon, polycrystalline silicon), silicon germanium (SiGe), gallium arsenide (GaAs), germanium (Ge), silicon on insulator (SOI), germanium on insulator (GOI), or any suitable combination thereof. The second substrate 421 may be a single layer substrate or a multi-layer substrate, for example, a monocrystalline single-layer substrate, a polycrystalline silicon (polysilicon) single-layer substrate, a polysilicon and metal multi-layer substrate, etc. Other materials may also be used.

Figure 6F:
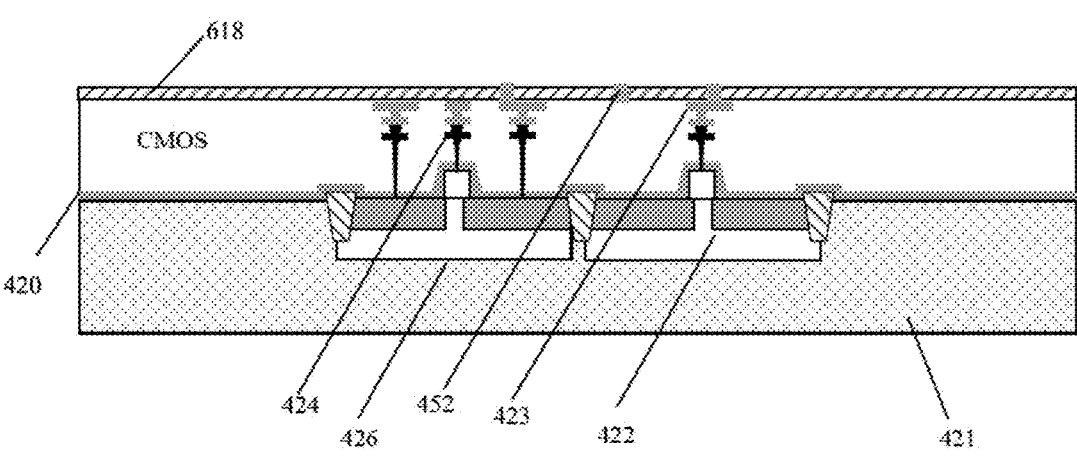

Further, at S612, also referring to FIG. 6F, a CMOS wafer 420 is fabricated based on the second substrate 421 including page buffers. For example, a peripheral circuit layer may be formed on the second substrate, including plurality of peripheral circuits. The peripheral circuits including any suitable LLV and LV digital, analog, and/or mixed-signal peripheral circuits 422 used for facilitating the operation of the 3D memory device. The peripheral circuits may also include HV circuits 426 of the page buffers, and page buffers may be formed in the page buffer region. The page buffer region corresponds to the cell region of the array wafer. Various interconnects 423 and 424 may also be formed.

In certain embodiments, a CMOS joint layer 618 may also be formed. The CMOS joint layer 618 may be an interconnection layer including one or more joint structures embedded in a dielectric layer. The joint structures 452 may include contacts, single-layer/multi-layer vias, conductive lines, plugs, pads, and/or any other suitable conductive structures that are made by conductive materials including W, Co, Cu, Al, doped silicon, silicides, or any combination thereof. The dielectric layer may include dielectric materials including silicon oxide, silicon nitride, silicon oxynitride, or any combination thereof. One or more portions of the joint structures may be exposed on the top surface of the CMOS joint layer on the CMOS wafer.

Figure 6G:
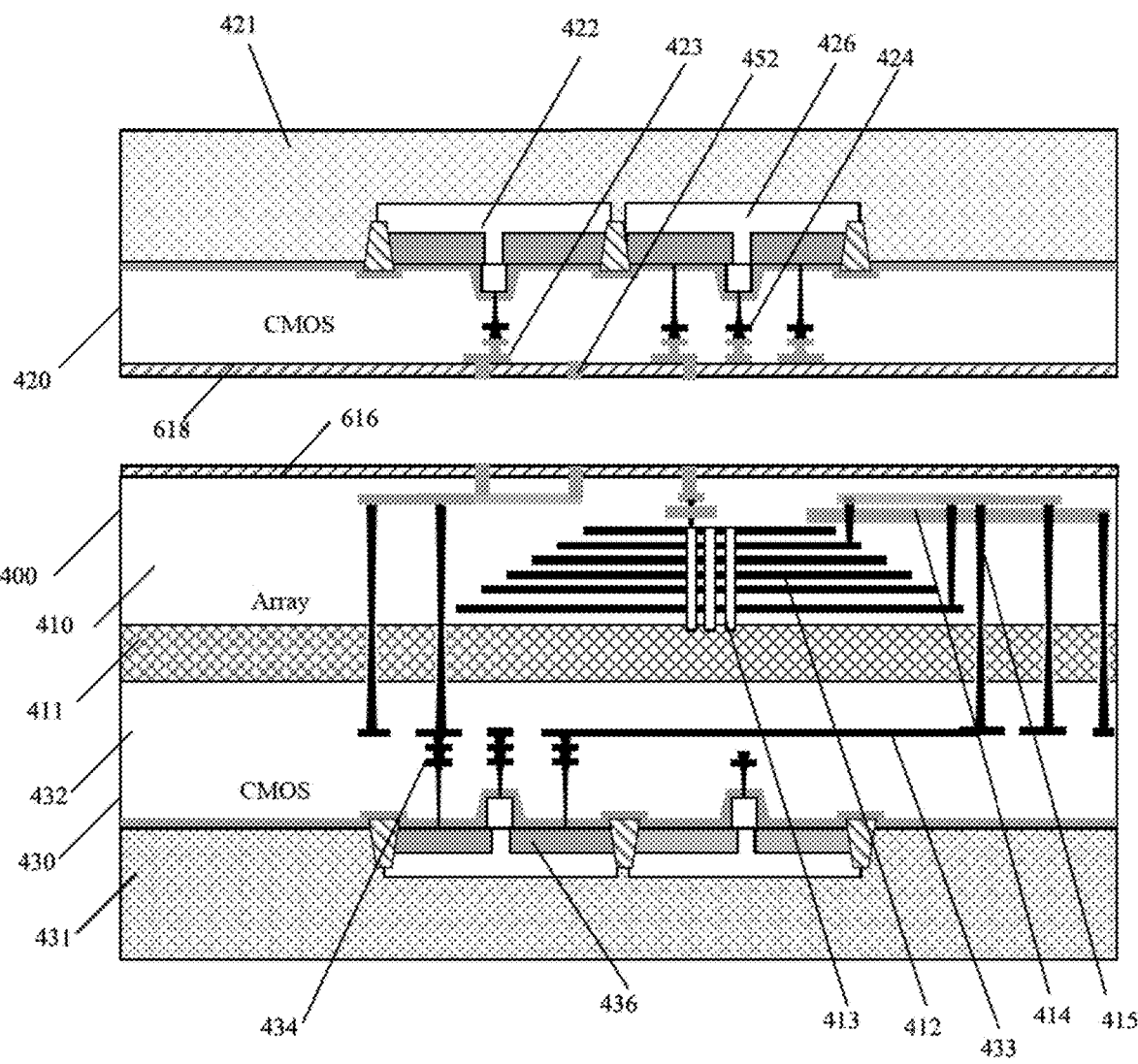

Further, at S614, also referring to FIG. 6G, the memory array wafer 400 and the CMOS wafer 420 are bonded together to form a 3D memory device 100. For example, the CMOS wafer 420 may be flipped over to face down towards the array wafer 400 for bonding the array joint layer 616 of the array wafer 400 to the CMOS joint layer 618 of the CMOS wafer 420. The bonding interface is between the array joint layer and the CMOS joint layer. Therefore, the bonding interface includes both the interface between two dielectric layers (e.g., between a silicon nitride layer and a silicon oxide layer) and the interface between two conductive layers (e.g., between metal contacts). In some embodiments, one or more joint structures in the array wafer 400 and one or more joint structures in the CMOS wafer 420 can be contacted with each other at bonding interface for electrical connection.

Figure 6H:
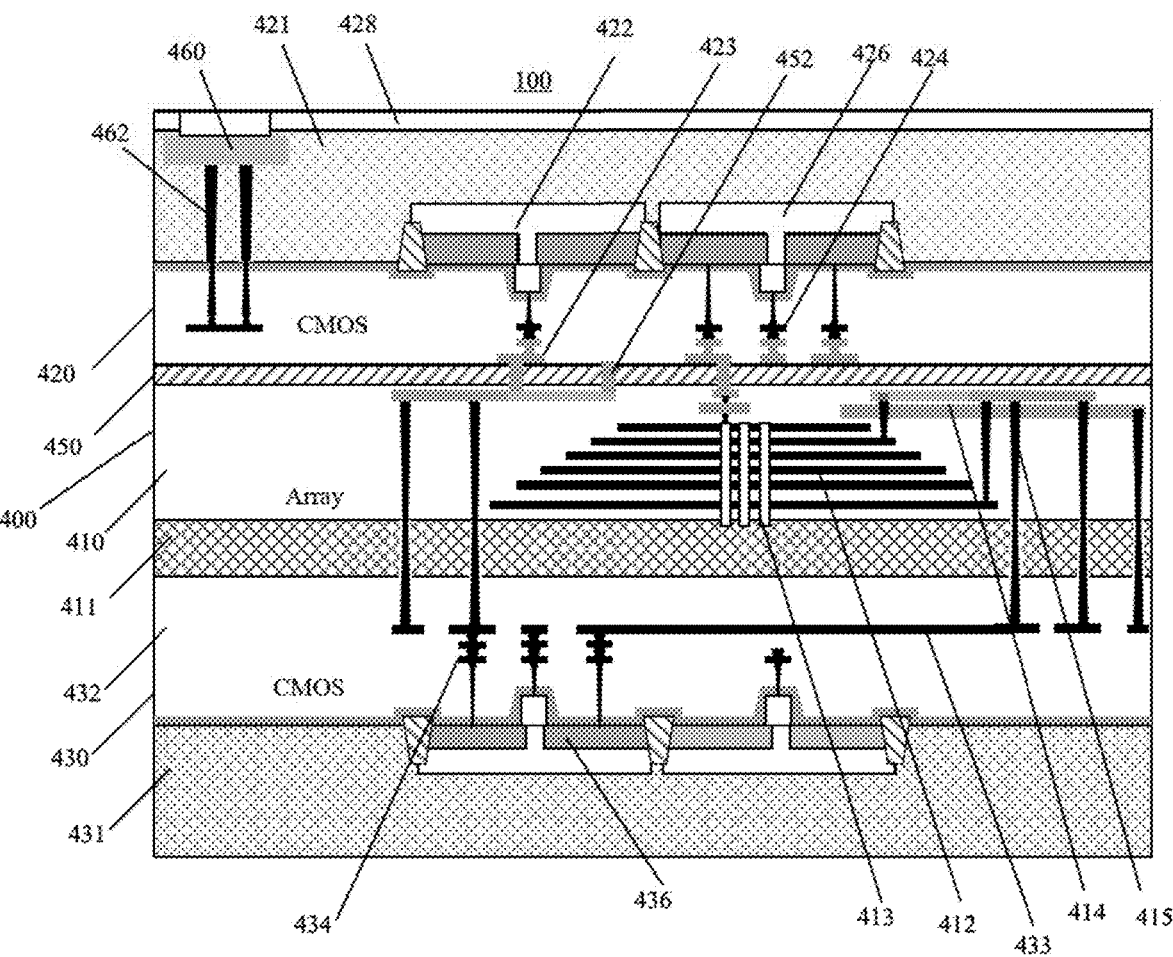

Further, at S616, also referring to FIG. 6H, a 3D memory device 100 is formed from the bonded memory array wafer 400 and CMOS wafer 420. For example, the second substrate 421 may be thinned by one or more suitable processes, and at least one through substrate contact (TSC) 462 may be formed to penetrate the second substrate 421 to connect with the devices of the array wafer 400 and/or devices of the CMOS wafer 420. Further, an isolating layer 428 may be formed to cover the second substrate 421 and the at least one through substrate contact. The isolating layer 428 may include dielectric materials including silicon oxide, silicon nitride, silicon oxynitride, or any combination thereof. Further, a plurality of array pads 460 may be formed in contact with the least one through substrate contact 462, and the array pads 460 may be used for external input/output terminals. Other processes may also be included.

Figure 7:
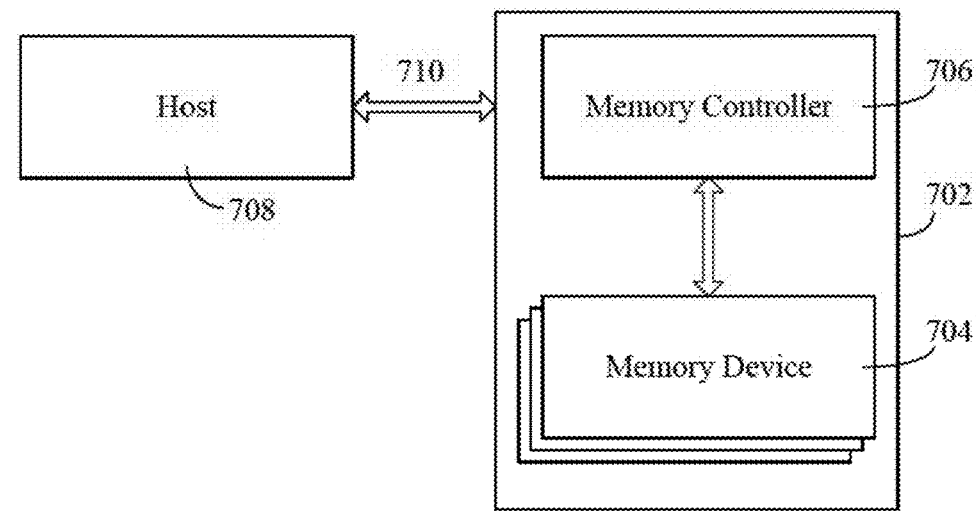
FIG. 7 illustrates a block diagram of an exemplary system having a memory device consistent with various disclosed embodiments in the present disclosure.

The above fabricated 3D memory device may be a part of other memory systems. FIG. 7 shows a block diagram of an exemplary system 700 having a memory device according to various aspects of the present disclosure. The system 700 may be a mobile phone (e.g., a smartphone), a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 7, the system 700 may include a host 708 and a memory system 702 having one or more memory devices 704 and a memory controller 706. The host 708 may be a processor of an electronic device, such as a central processing unit (CPU), or a system-on-chip (SoC), such as an application processor (AP). The host 708 may be configured to send or receive data to or from the memory devices 704.

The memory controller 706 is coupled to the memory devices 704 and host 708 and is configured to control the memory devices 704, according to some implementations. The memory controller 706 may also be integrated into the memory devices 704. The memory controller 706 may manage the data stored in the memory devices 704 and communicate with the host 708 with an interface 710. In some embodiments, the memory controller 706 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some other embodiments, the memory controller 706 is designed for operating in a high duty-cycle environment, such as solid-state drives (SSDs) or embedded multi-media-cards (eMMCs) used as data storage for mobile devices, such as smartphones, tablets, laptop computers, etc., and enterprise storage arrays. The memory controller 706 may be configured to control operations of the memory device 704, such as read, erase, and program operations.

Figure 8:
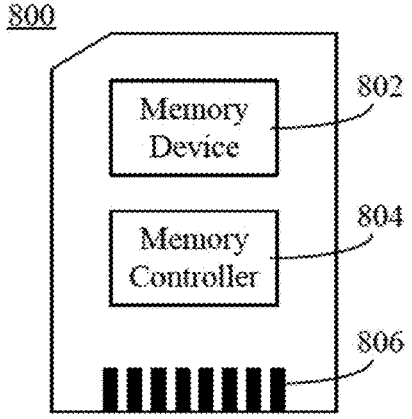
FIG. 8 illustrates a block diagram of an exemplary memory card having a memory device consistent with various disclosed embodiments in the present disclosure.
Figure 9:
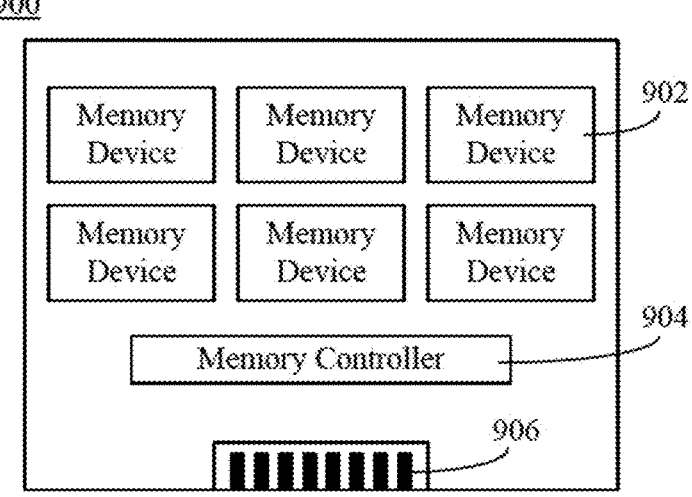
FIG. 9 illustrates a block diagram of an exemplary solid state disk (SSD) having a memory device consistent with various disclosed embodiments in the present disclosure.

The memory device 704 may be any memory device disclosed in the present disclosure. The memory controller 706 and one or more memory devices 704 may be integrated into various types of storage devices, for example, be included in the same package, such as a universal Flash storage (UFS) package or an eMMC package. That is, the memory system 702 may be implemented and packaged into different types of end electronic products. FIGS. 8 and 9 exemplarily illustrate block diagrams of a memory card 800 and an SSD 900 according to various aspects of the present disclosure. As shown in FIG. 8, a memory controller 804 and a single memory device 802 may be integrated into the memory card 800. The memory device 802 may include any memory device disclosed in the present disclosure. The memory card 800 may include a PC card (personal computer memory card international association (PCMCIA)), a CF card, a smart media (SM) card, a memory stick, a multimedia card (MMC, RS-MMC, or MMCmicro), an SD card (SD, miniSD, microSD, or SDHC), a UFS, etc. The memory card 800 may further include a memory card interface or interface connector 806 configured to couple the memory card 800 to a host (e.g., the host 308 shown in FIG. 7). As shown in FIG. 9, a memory controller 904 and multiple memory devices 902 may be integrated into the SSD 900. The memory devices 902 may include any aforementioned memory device disclosed in the present disclosure. The SSD 900 may further include an SSD interface or interface connector 906 configured to couple the SSD 900 to a host (e.g., the host 308 shown in FIG. 7).

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A three-dimensional (3D) memory device, comprising:

an array wafer having a memory array layer and a complementary metal-oxide-semiconductor (CMOS) layer stacked together, the CMOS layer having high-voltage (HV) circuitry of a plurality of peripheral devices, and the memory array layer having a plurality of memory cells and a stair structure, wherein the memory array layer includes at least one cell region for forming the memory cells and at least one stair structure region for forming the stair structure, and the CMOS layer includes at least one driver region; and a CMOS wafer having low-voltage (LV) circuitry and low-low-voltage (LLV) circuitry of the plurality of peripheral devices, wherein the CMOS wafer includes at least one page buffer region, wherein the array wafer and the CMOS wafer are bonded at a bonding interface;

the bonding interface is between a CMOS joint layer of the CMOS wafer and an array joint layer of the array wafer; and the CMOS joint layer of the CMOS wafer and the array joint layer of the array wafer are bonded, and one or more joint structures on the array joint layer of the array wafer and one or more joint structures on the CMOS joint layer of the CMOS wafer are bonded together for electrical connection, and a vertical projection of the at least one page buffer region of the CMOS wafer fits within a vertical projection of the at least one cell region of the memory array layer.

2. The 3D memory device according to claim 1, wherein:

the CMOS wafer includes a plurality of page buffers formed in the at least one page buffer region, including HV circuits of the page buffers, and the at least one page buffer region corresponds to the at least one cell region; and the CMOS layer includes a driver formed in the at least one driver region, and the driver region corresponds to the at least one stair structure region.

3. A three-dimensional (3D) memory device, comprising:

an array wafer having a memory array layer and a complementary metal-oxide-semiconductor (CMOS) layer stacked together, the CMOS layer having high-voltage (HV) circuitry of a plurality of peripheral devices, and the memory array layer having a plurality of memory cells and a stair structure, wherein the memory array layer includes at least one cell region for forming the memory cells and at least one stair structure region for forming the stair structure, and the CMOS layer includes at least one driver region; and a CMOS wafer having low-voltage (LV) circuitry and low-low-voltage (LLV) circuitry of the plurality of peripheral devices, wherein the CMOS wafer includes at least one page buffer region, wherein the array wafer and the CMOS wafer are bonded at a bonding interface;

the CMOS wafer includes a plurality of page buffers formed in the at least one page buffer region, including HV circuits of the page buffers, and the at least one page buffer region corresponds to the at least one cell region;

the CMOS layer includes a driver formed in the at least one driver region, and the driver region corresponds to the at least one stair structure region;

the at least one cell region is a single center portion of the memory array layer, and the at least one stair structure region are two side portions of the memory array layer;

the at least one page buffer region is a single center portion of the CMOS wafer; and the at least one driver region are two side portions of the CMOS layer.

4. A three-dimensional (3D) memory device, comprising:

an array wafer having a memory array layer and a complementary metal-oxide-semiconductor (CMOS) layer stacked together, the CMOS layer having high-voltage (HV) circuitry of a plurality of peripheral devices, and the memory array layer having a plurality of memory cells and a stair structure, wherein the memory array layer includes at least one cell region for forming the memory cells and at least one stair structure region for forming the stair structure, and the CMOS layer includes at least one driver region; and a CMOS wafer having low-voltage (LV) circuitry and low-low-voltage (LLV) circuitry of the plurality of peripheral devices, wherein the CMOS wafer includes at least one page buffer region, wherein the array wafer and the CMOS wafer are bonded at a bonding interface;

the CMOS wafer includes a plurality of page buffers formed in the at least one page buffer region, including HV circuits of the page buffers, and the at least one page buffer region corresponds to the at least one cell region;

the CMOS layer includes a driver formed in the at least one driver region, and the driver region corresponds to the at least one stair structure region;

the at least one cell region are two side portions of the memory array layer, and the at least one stair structure region is a single center portion of the memory array layer;

the at least one page buffer region are two side portions of the CMOS wafer; and the at least one driver region is a single center portion of the CMOS layer.

5. The 3D memory device according to claim 2, wherein the CMOS layer is formed based on a peripheral-under-chip (PUC) mechanism, and the CMOS layer is located under the memory array layer and separated by a base layer for forming the memory array layer.

6. The 3D memory device according to claim 5, wherein the base layer is a polysilicon layer, the array wafer includes a first substrate, the CMOS layer comprises a device layer formed on the first substrate, the polysilicon layer is formed on the device layer of the CMOS layer, and the memory array layer is formed on the polysilicon layer.

7. The 3D memory device according to claim 6, wherein the CMOS wafer includes a second substrate for forming HV circuits of the page buffers and the low-voltage (LV) circuitry and low-low-voltage (LLV) circuitry of the plurality of peripheral devices.

8. The 3D memory device according to claim 1, wherein the 3D memory device further comprises:

an insulating layer formed over the second substrate;

at least one through substrate contact penetrating the second substrate; and at least one array pad in contact with the at least one through substrate contact.

9. The 3D memory device according to claim 3, wherein the CMOS layer is formed based on a peripheral-under-chip (PUC) mechanism, and the CMOS layer is located under the memory array layer and separated by a base layer for forming the memory array layer.

10. The 3D memory device according to claim 9, wherein the base layer is a polysilicon layer, the array wafer includes a first substrate, the CMOS layer comprises a device layer formed on the first substrate, the polysilicon layer is formed on the device layer of the CMOS layer, and the memory array layer is formed on the polysilicon layer.

11. The 3D memory device according to claim 10, wherein the CMOS wafer includes a second substrate for forming HV circuits of the page buffers and the low-voltage (LV) circuitry and low-low-voltage (LLV) circuitry of the plurality of peripheral devices.

12. The 3D memory device according to claim 3, wherein the 3D memory device further comprises:

an insulating layer formed over the second substrate;

at least one through substrate contact penetrating the second substrate; and at least one array pad in contact with the at least one through substrate contact.

13. The 3D memory device according to claim 4, wherein the CMOS layer is formed based on a peripheral-under-chip (PUC) mechanism, and the CMOS layer is located under the memory array layer and separated by a base layer for forming the memory array layer.

14. The 3D memory device according to claim 13, wherein the base layer is a polysilicon layer, the array wafer includes a first substrate, the CMOS layer comprises a device layer formed on the first substrate, the polysilicon layer is formed on the device layer of the CMOS layer, and the memory array layer is formed on the polysilicon layer.

15. The 3D memory device according to claim 14, wherein the CMOS wafer includes a second substrate for forming HV circuits of the page buffers and the low-voltage (LV) circuitry and low-low-voltage (LLV) circuitry of the plurality of peripheral devices.

16. The 3D memory device according to claim 4, wherein the 3D memory device further comprises:

an insulating layer formed over the second substrate;

at least one through substrate contact penetrating the second substrate; and at least one array pad in contact with the at least one through substrate contact.

* * * * *